United States Patent
Butler et al.

(10) Patent No.: US 9,977,349 B2
(45) Date of Patent: May 22, 2018

(54) SUPPORT DEVICE, LITHOGRAPHIC APPARATUS AND DEVICE MANUFACTURING METHOD

(71) Applicant: ASML NETHERLANDS B.V., Veldhoven (NL)

(72) Inventors: Hans Butler, Best (NL); Cornelius Adrianus Lambertus De Hoon, Eindhoven (NL); Ingmar August Kerp, Eindhoven (NL); Pieter Johannes Gertrudis Meijers, Horst (NL); Jeroen Pieter Starreveld, Eindhoven (NL); Derk Ten Hoopen, Veldhoven (NL); Martinus Van Duijnhoven, Deurne (NL); Edward Hage, Helmond (NL); Evert Hendrik Jan Draaijer, Eindhoven (NL); Wesley Ooms, Geldrop (NL)

(73) Assignee: ASML NETHERLANDS B.V., Veldhoven (NL)

( * ) Notice: Subject to any disclaimer, the term of this patent is extended or adjusted under 35 U.S.C. 154(b) by 9 days.

(21) Appl. No.: 15/109,427

(22) PCT Filed: Dec. 18, 2014

(86) PCT No.: PCT/EP2014/078541
§ 371 (c)(1),
(2) Date: Jun. 30, 2016

(87) PCT Pub. No.: WO2015/106925
PCT Pub. Date: Jul. 23, 2015

(65) Prior Publication Data
US 2016/0334718 A1    Nov. 17, 2016

Related U.S. Application Data

(60) Provisional application No. 61/928,913, filed on Jan. 17, 2014.

(51) Int. Cl.
*G03F 7/20* (2006.01)
*F16F 15/023* (2006.01)

(52) U.S. Cl.
CPC ...... *G03F 7/70866* (2013.01); *F16F 15/0232* (2013.01); *G03F 7/709* (2013.01); *G03F 7/70733* (2013.01); *G03F 7/70833* (2013.01)

(58) Field of Classification Search
CPC .............. F16F 15/0232; G03F 7/70733; G03F 7/70833; G03F 7/70866; G03F 7/709
See application file for complete search history.

(56) References Cited

U.S. PATENT DOCUMENTS

| 2004/0083966 A1 | 5/2004 | Takahashi et al. |
| 2006/0126040 A1 | 6/2006 | Butler et al. |

(Continued)

FOREIGN PATENT DOCUMENTS

| JP | 2004-270735 | 9/2004 |
| JP | 2006-322468 | 11/2006 |

(Continued)

OTHER PUBLICATIONS machine translation of JP 2004-270735, retrieved Sep. 3, 2017.*

(Continued)

*Primary Examiner* — Steven H Whitesell Gordon
(74) *Attorney, Agent, or Firm* — Pillsbury Winthrop Shaw Pittman LLP

(57) ABSTRACT

A support device configured to support a first part relative to a second part, minimizing the transfer of vibration between the two parts, includes a supporting system configured to use gas under pressure to provide a support force between the first and second parts; a gas chamber connected to the supporting system and configured to contain the gas under pressure and provide the gas under pressure to the supporting system; and a section of acoustic damping material, (Continued)

arranged at a location within the gas chamber so as to separate a first gas containing region and a second gas containing region within the gas chamber, wherein the section of acoustic damping material has a first side and a second side, wherein the first gas containing region is on the first side and the second gas containing region is on the second side.

15 Claims, 3 Drawing Sheets

(56) References Cited

U.S. PATENT DOCUMENTS

| | | |
|---|---|---|
| 2008/0013058 A1 | 1/2008 | Tatsuzaki |
| 2009/0097008 A1 | 4/2009 | Mos et al. |
| 2010/0157264 A1 | 6/2010 | Butler et al. |

FOREIGN PATENT DOCUMENTS

| | | |
|---|---|---|
| JP | 2009-094512 | 4/2009 |
| JP | 2009-162273 | 7/2009 |
| WO | WO 96/04491 | 2/1996 |

OTHER PUBLICATIONS

International Search Report dated Mar. 9, 2015 in corresponding International Patent Application No. PCT/EP2014/078541.

Wheeler, Mark, "DIY loudspeakers series—Part III", downloaded from http://www.tnt-audio.com/clinica/speaker_design_pt3_getstuffed_e.html, printed on May 31, 2016, 6 pages.

Japanese Office Action dated Aug. 2, 2017 in corresponding Japanese Patent Application No. 2016-537008.

* cited by examiner

SUPPORT DEVICE, LITHOGRAPHIC APPARATUS AND DEVICE MANUFACTURING METHOD

CROSS-REFERENCE TO RELATED APPLICATIONS

This application is the U.S. National Stage of PCT/EP2014/078541, filed Dec. 18, 2014, which in turn claims the benefit of priority to U.S. provisional application Ser. No. 61/928,913, which was filed on Jan. 17, 2014, the entire contents of all applications are incorporated herein by reference in their entireties.

FIELD

The present invention relates to a support device, a lithographic apparatus comprising such a support device and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction.

The pattern to be transferred to the substrate may include very small structures. Any mechanical disturbance such as a vibration or the like may result in an erroneous transfer rendering the substrate unusable. To minimize a transfer of vibrations and other mechanical disturbances from any external structure, such as a support structure or floor, to the lithographic apparatus, in particular a substrate table, a pattern support structure and/or a projection system thereof, it is known to employ one or more vibration isolation support devices to support the lithographic apparatus.

Such a vibration isolation support device supports the lithographic apparatus, i.e. at least partly compensates a gravitational force exerted thereon. Thus, the vibration isolation support device provides a mechanical connection between the lithographic apparatus and an external structure, e.g. a floor. Depending on a frequency of the vibration, a vibration present in the external structure may be (partly) damped and/or attenuated by the isolation support device and/or (partly) transferred from the external structure to the lithographic apparatus. The amount of attenuation and/or transfer of a vibration of a certain frequency depends on a stiffness of the vibration isolation support device. A relatively small stiffness results in relatively high vibration isolation. Therefore, it is desirable to have a vibration isolation support device having a small stiffness.

A well-known vibration isolation support device is an airmount. Such an airmount includes a gas chamber containing an amount of pressurized air and a moveable member partly positioned in the gas chamber. The pressure of the air exerts a support force on the moveable member. An object such as a lithographic apparatus, or a part thereof, is supported on the moveable member. The known airmount has such a (positive) stiffness that it is suitable to attenuate vibrations above a predetermined frequency such that a pattern having a predetermined minimum feature size may be correctly transferred. However, there is a need to transfer smaller structures having smaller feature sizes. Therefore, it is desirable to minimize errors that may result from resonant responses of the support device.

SUMMARY

It is desirable to have a vibration isolation device having a small stiffness and a damped response at resonant frequency.

According to an embodiment of the invention, there is provided support device configured to support a first part relative to a second part, minimising the transfer of vibration between the two parts, comprising:

a supporting system configured to use gas under pressure to provide a support force between the first and second part;

a gas chamber connected to the supporting system and configured to contain said gas under pressure and provide said gas under pressure to the supporting system; and a section of acoustic damping material, arranged at a location within said gas chamber such that it separates first and second gas containing regions within the gas chamber on either side of said section of acoustic damping material.

According to an embodiment of the invention, there is provided a lithographic apparatus comprising at least one such support device.

According to an embodiment of the invention, there is provided a device manufacturing method comprising projecting a patterned beam of radiation onto a substrate using a projection system; and supporting at least one of a position sensor and the projection system using at least one such support device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
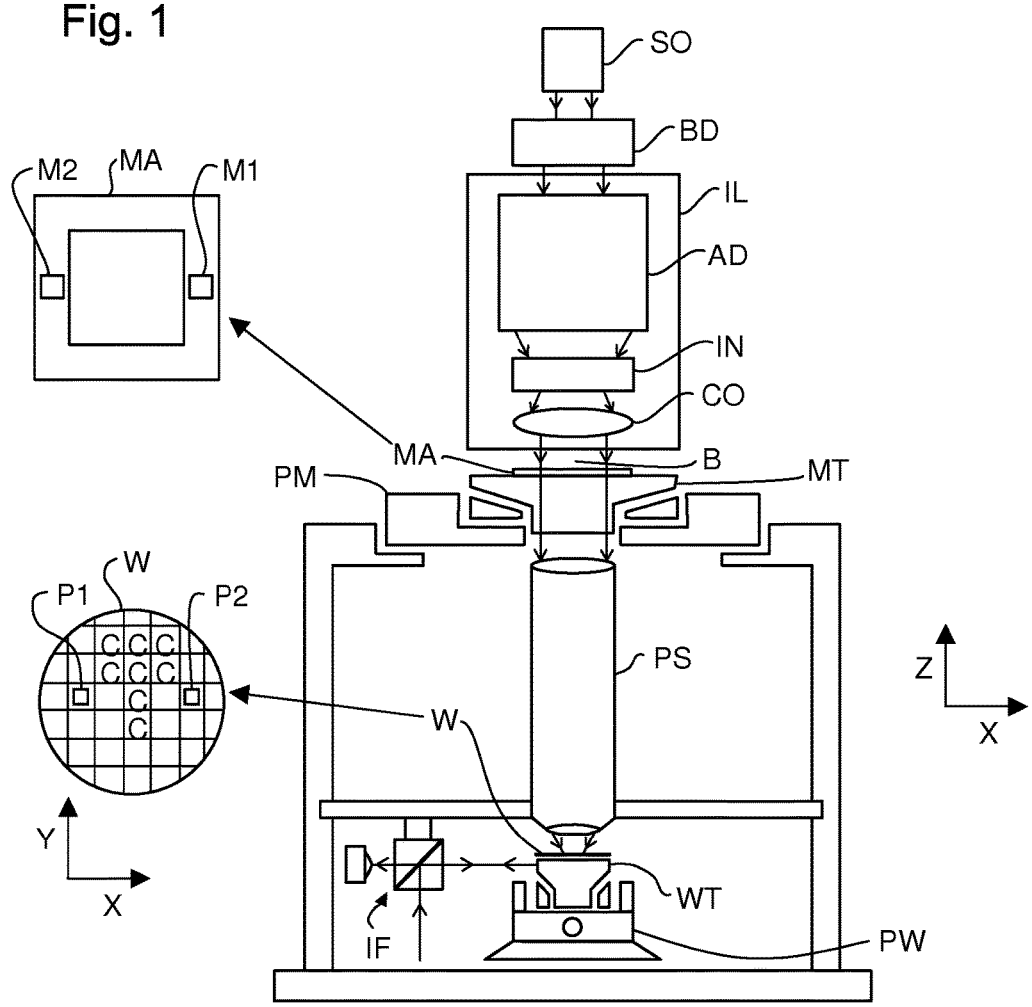
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source SO and the lithographic apparatus may be separate entities, for example when the source SO is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
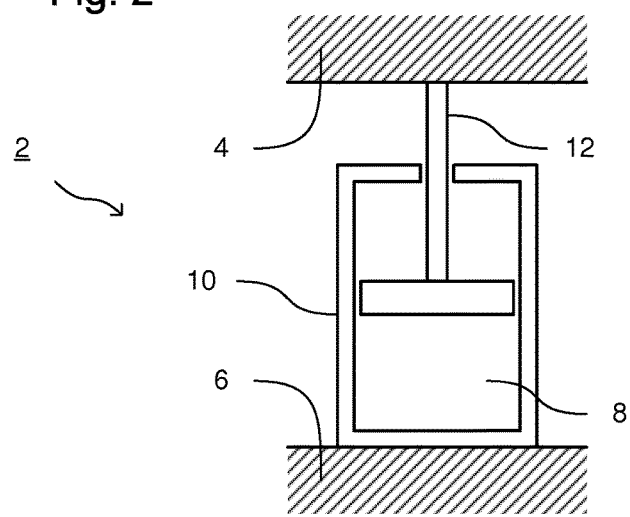
FIG. 2 schematically depicts a support device in order to explain its operation.

FIG. 2 schematically illustrates a conventional airmount 2 for supporting an apparatus 4 such as a lithographic apparatus or a part thereof. The airmount 2 is supported on a floor 6, but may as well be supported by any apparatus or suitable structure, including a frame such as a base frame (e.g. the base frame of the lithographic apparatus). The airmount 2 contains an amount of gas 8, e.g. air, in a gas chamber formed by gas chamber walls 10 and a moveable member 12, which may move with respect to the gas chamber walls 10. Due to the pressure in the gas 8, a force is exerted on the moveable member 12. This force may be employed to compensate a gravitational force exerted on the apparatus 4.

If the floor 6 vibrates, i.e. exerts a time-dependent force on the gas chamber wall 10, the gas chamber wall 10 attempts to move with respect to the moveable member 12, resulting in a change of the volume containing the gas 8. A volume change results in a pressure change and thus in a change of the force exerted on the moveable member 12. Thus, the vibration of the floor 6 may (partly) be transferred to the apparatus 4. A transfer ratio is, inter alia, dependent on the frequency of the vibration and on the stiffness of the airmount 2. According to embodiments of the present invention, the airmount 2 may be designed such that its stiffness is low and the resonant responses damped.

Figure 3:
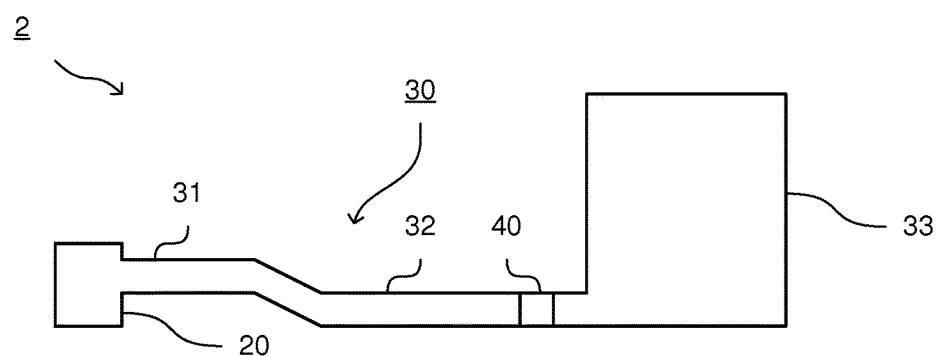
FIG. 3 schematically depicts a support device according to an embodiment of the present invention.

FIG. 3 schematically depicts a support device 2 according to an embodiment of the present invention, namely an airmount that may be used to support an apparatus, such as a lithographic apparatus or a part thereof. The support device 2 includes a supporting section 20 connected to a gas chamber 30. As discussed above, the supporting section 20 uses gas under pressure to provide a support force. For example, the supporting section 20 may provide a support force between a floor 6 as discussed above and a component of a lithographic apparatus. However, in general, it may provide a support force between any two parts.

The gas chamber 30 is configured to provide the gas under pressure to the supporting section 20. The gas chamber 30 may have any convenient configuration. In general, the gas chamber 30 may be configured to have a sufficiently large volume in order to lower the stiffness of the support device 2 to a required level. If the support device 2 is to be used within a lithographic apparatus, there may be space constraints, in particular around the location of the supporting section 20. In one arrangement, a support device 2 may therefore be configured as depicted in FIG. 3, in which the gas chamber 30 is comprised of first and second gas chamber sections 31, 32 that are elongate and/or tube-like. In addition, the gas chamber 30 may include a third gas chamber section 33 formed as a tank that provides a substantial proportion, or a majority, of the total volume of the gas chamber 30. In an arrangement such as that depicted in FIG. 3, the first and second gas chamber sections 31, 32 function to connect the third gas chamber section 33 to the supporting section 20 in addition to forming part of the gas chamber 30.

As discussed above, the total volume of the gas chamber 30 may be selected in order to provide a desired stiffness of the support device 2. This may ensure that the transmissibility, namely the transfer of vibration from a first apparatus to a second apparatus supported by the support device 2, is below a required level. In the case of a lithographic apparatus, the support device 2 may be used to support a reference frame on which position sensor IF is mounted and on which the projection system PS may be mounted. Maintaining a suitably low transmissibility for such a system may help minimize overlay errors in patterns formed by the lithographic apparatus. The configuration of the gas chamber 30 may be selected in order to fit space constraints of the lithographic apparatus within which the support device 2 is to be provided.

However, an embodiment of the present invention recognizes that, even if a desired stiffness of the support device 2 is provided, the support device 2 may have one or more resonant frequencies at which the transmissibility may be higher than is acceptable or desirable. In order to avoid the resonant frequency falling within a range of expected excitation of an apparatus supporting the support device 2, such as a floor 6 or a base frame provided between the floor 6 and the support device 2, the resonant frequency may be adjusted by reducing the stiffness of the support device 2. For example, this may be achieved by increasing the size of the gas chamber 30. However, it may not be desirable, or may not be possible, to increase the size of the gas chamber 30 sufficiently in some circumstances. Therefore, according to an embodiment of the present invention, alternatively or additionally a section of acoustic damping material 40 is provided within the gas chamber 30.

The section of acoustic damping material 40 is arranged to separate the gas chamber 30 into at least first and second regions within the gas chamber 30. The first region is on one side of the section of the acoustic damping material 40. The second region is on another side of the section of the acoustic damping material 40. Accordingly, on opposite sides of the acoustic damping material, there are regions of the gas chamber 30 that do not contain acoustic damping material. Those regions of the gas chamber 30 function in the same way as a gas chamber 30 without acoustic damping material, providing a low stiffness support device 2.

The provision of the acoustic damping material 40 may dampen the response of the support device 2 at the acoustic resonant frequency in the tank volume. Accordingly, at the resonant frequency, the magnitude of the vibration transferred through the support device 2 may be reduced. Accordingly, this improves the transmissibility of the support device 2. In the case of a support device 2 used within a lithographic apparatus to support a reference frame to which at least the position sensor IF is mounted, it has been found that this in turn may improve the overlay errors of patterns formed by the lithographic apparatus.

In order for the use of the acoustic damping material to have maximum benefit, the material may be arranged within the section of the gas chamber at which it is located such that, at that location, the acoustic damping material 40 fills an entire cross-section of the gas chamber 30. In such an arrangement, it may be ensured that, for any gas to flow between the two regions of the gas chamber 30 on either side of the acoustic damping material 40, the gas must pass through the acoustic damping material. This means that gas-flow cannot bypass the acoustic damping material 40.

The location at which to provide the acoustic damping material 40 may be carefully selected in order to control and/or optimize its effect. In particular, a section of acoustic damping material 40 may be arranged at a location selected to provide optimal damping of a particular resonant frequency. A good location may be determined and/or optimized by trial and error. However, it may be time-consuming to identify a good location in this manner.

In an embodiment of the present invention, the location of the acoustic damping material 40 may be selected, or a starting point for a trial and error optimization may be selected, by an analysis of the configuration of the gas chamber 30. This may make it faster or easier to determine where to locate the acoustic damping material compared to using trial and error. Alternatively or additionally, it may provide a configuration with a better response. In an embodiment, the section of acoustic damping material 40 may be located at a point that is identified as being the location at which the acoustic pressure is a minimum and/or the particle velocity is a maximum if the support device 2 is excited at the resonant frequency. This has been found by the present inventors to provide a good location at which to place the acoustic damping material 40 for improving the response at the resonant frequency.

Depending on the particular configuration of the gas chamber 30 and the resonant frequencies of the support device 2 that are considered to be problematic for the intended use of the support device 2, there may be specific locations at which it may be desirable to provide a section of acoustic damping material 40.

For example, it may be desirable to provide a section of acoustic damping material substantially in the middle of the gas chamber 30. Depending on the configuration of the gas chamber 30, this may be considered to be the location at which the volume of the parts of the gas chamber on either side of the section of acoustic damping material 40 is substantially the same. By substantially the same, it is meant that the difference in volume between the two parts of the gas chamber 30 may be less than 25% of the volume of either part, optionally less than 10%, optionally less than 5%, optionally less than 1%.

For some configurations of the gas chamber, for example if the gas chamber 30 is generally elongate in nature with the supporting section 20 connected at one end of the gas chamber 30, the middle of the gas chamber 30 may simply be substantially halfway between the first and second ends of the gas chamber 30. By substantially the same, it is meant that the difference in distance from the middle to the two ends may be less than 25%, optionally less than 10%, optionally less than 5%, optionally less than 1%.

In the arrangement depicted in FIG. 3, the section of acoustic damping material 40 is provided substantially at the join between the second gas chamber section 32 of the gas chamber 30 and the third gas chamber section 33, which has a significantly larger cross section, for example at least twice as large, than the second gas chamber section 32. In general, it may be beneficial to locate a section of acoustic damping material at such a join between two sections of the gas chamber having significantly different cross sections, for example where the cross section of one is at least twice the cross section of the other.

In a support device 2 of an embodiment of the present invention, there may be more than one resonant frequency for which it is desirable to dampen the response of the support device 2. For each of the resonant frequencies, a different location may be identified at which a section of acoustic damping material 40 is to be provided. For example, for each resonant frequency, there may be a different location at which the acoustic pressure is a minimum and the particle velocity is a maximum during excitation at that frequency. Accordingly, a separate section of acoustic damping material 40, 41 may be provided at the respective locations associated with different resonant frequencies. Such an arrangement is depicted in FIG. 4.

As discussed above, multiple sections of acoustic damping material 40, 41 may be provided at different locations within a gas chamber 30 in order to dampen different resonant frequencies. Alternatively or additionally, multiple sections of acoustic damping material 42, 43, 44 may be provided within a gas chamber 30 in order to dampen a single resonant frequency.

Figure 4:
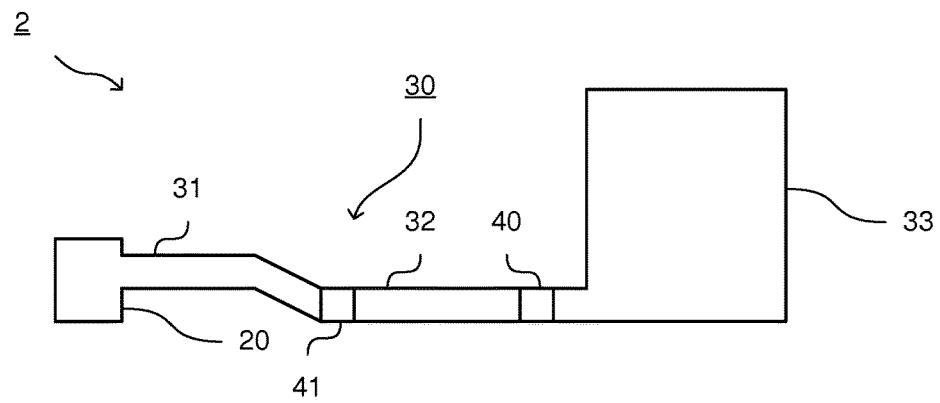
FIG. 4 schematically depicts a variation of the support device depicted in FIG. 3.
Figure 5:
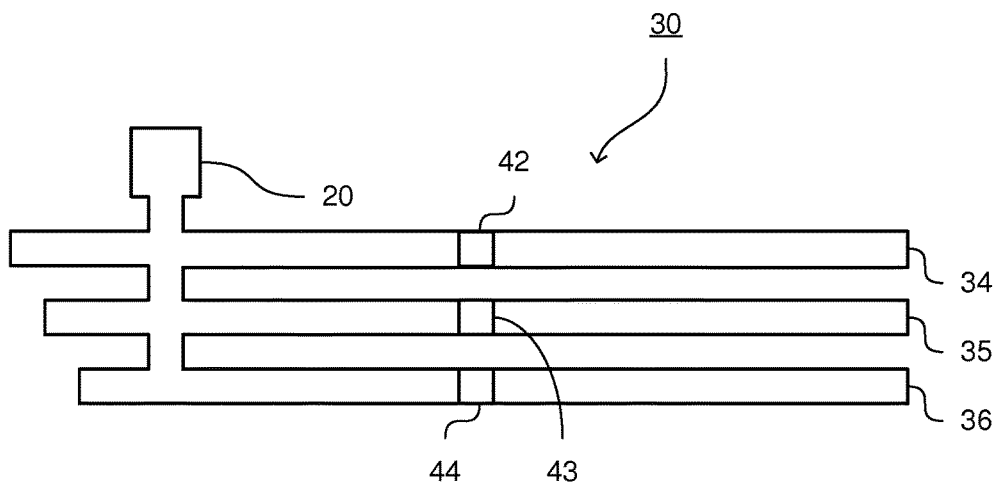
FIG. 5 schematically depicts a support device according to an embodiment of the present invention.

For example, as depicted in FIG. 5, a gas chamber 30 may be formed from a plurality of sections 34, 35, 36 that are connected in parallel rather than as in the arrangement depicted in FIGS. 3 and 4, in which the sections 31, 32, 33 or the gas chamber 30 are connected in series. For example, in the arrangement depicted in FIG. 5, the gas chamber 30 is formed from elongate tube-like sections 34, 35, 36 that each extend from a first end to a second end. The support section 20 is commonly connected to the first end of each of the sections 34, 35, 36 of the gas chamber 30. In such an arrangement, a section of acoustic damping material 42, 43, 44 may be provided to each of the sections 34, 35, 36 of the gas chamber in order to dampen the same resonant frequency. For example, in the arrangement depicted in FIG. 5, each of the sections of acoustic damping material 42, 43, 44 are provided midway between the first and second ends of the sections 34, 35, 36 of the gas chamber 30.

At each of the locations at which the sections of acoustic damping material 42, 43, 44 are provided, there may be a local minimum acoustic pressure and/or local maximum particle velocity. Accordingly, the locations may be selected by an appropriate analysis and/or may be determined/optimized by trial and error.

Any of a variety of materials may be used in order to provide the acoustic damping material. The material should be capable of permitting gas flow through the material but should provide a degree of flow resistance in order to provide damping at resonant frequencies.

In general, suitable materials to form acoustic damping may include wool, other fibrous materials, including natural fibers and artificial fibers, and foams, including for example metal foams and melamine foam. An example of a metal foam that may be used is Recemat®, manufactured by Recemat BV and is formed from nickel and, optionally, chromium.

Depending on the nature of the material used, it may be desirable to encase the acoustic damping material within a container in order to retain it. For example, if wool is being used, it may be retained within a capsule having a mesh at either end having apertures of 20 μm or less.

In any case, if the support device 2 is to be used in a lithographic apparatus, filters may also be provided, at least between the acoustic damping material 40 and the supporting section 20 in order to reduce the transfer of contamination from the acoustic damping material to the supporting section 20. Optionally, filters may be provided on both sides of the acoustic damping material 40. For example, a HEPA (high-efficiency particulate absorption) filter may be used. Such a filter may be configured to remove from gas passing through the filter at least 99.97% of particles having a size of 0.3 μm or larger.

Figure 6:
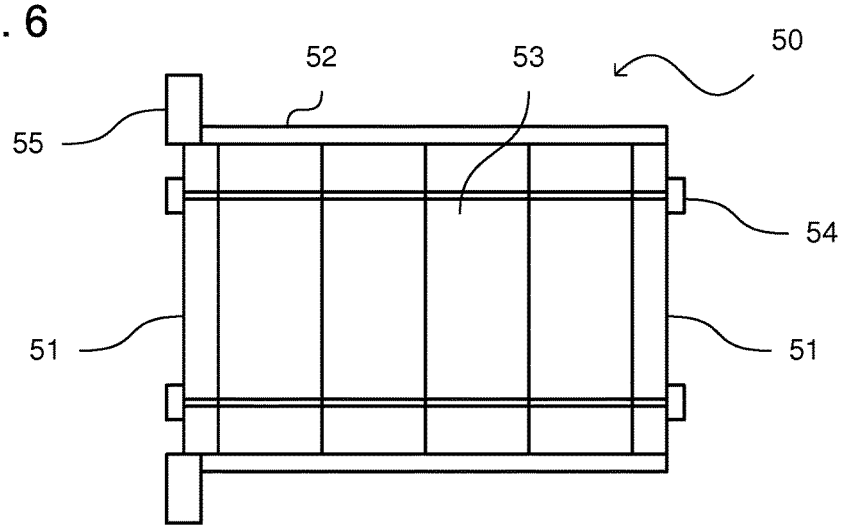
FIG. 6 depicts a unit that may be used to secure acoustic damping material for use in an embodiment of the present invention.

FIG. 6 schematically depicts an arrangement of a unit for providing acoustic damping material that may be used in the present invention. The unit 50 comprises rigid end plates 51 that have sufficient openings formed within them to permit easy flow of gas through the end plates 51. Between the end plates 51 a solid housing 52 may be provided that maintains the separation of the end plates 51 and may be gas tight. Within the housing 52, and between the end plates 51, a plurality of layers of acoustic damping material, such as a metal or melamine foam may be provided. It should be appreciated, however, that a single section of acoustic damping material may also be used. If needed, tie rods 54 may be provided to secure the rigid end plates 51 and/or pre-stress the acoustic damping material.

Depending on the configuration of gas chamber 30 in which the acoustic damping material is to be provided, the unit 50 may be dimensioned to fit within a section of the gas chamber 30 such that gas must flow through the openings in the end plates 51 and therefore through the layers of acoustic damping material 53. For example, the exterior dimension of the outer casing 52 may match the interior dimension of a section of the gas chamber 30, in which case it may be located within the section of the gas chamber 30.

In an alternative arrangement, the unit 50 may be configured such that the external housing 52 forms part of the gas chamber 30. In such an arrangement, the outer housing 52 may function as a section of the gas chamber 30 and, for example, be connected to other sections of the gas chamber 30 on either side. A flange 55 may be provided at one or both ends of the unit 55 in order to secure the unit 55 to a section of the gas chamber 50.

Figure 7:
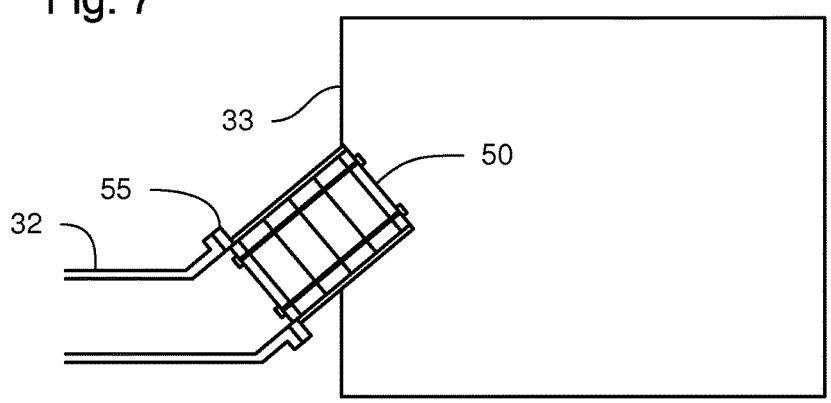
FIG. 7 schematically depicts an arrangement in which a unit such as that depicted in FIG. 6 may be mounted within a part of a support device according to the present invention.

In a further arrangement, as depicted in FIG. 7, the unit 50 may be configured such that the unit 50 may fit, at least partially, within a relatively large section 33 of the gas chamber and/or at the junction between an elongate section 32 of gas chamber 30 and a relatively large section 33 of the gas chamber 30, connected at one end by the flange 55 to the end of an adjoining section 32 of the gas chamber 30. As shown in FIG. 7, at least a part of the unit 50 may effectively form part of the elongate section of the gas chamber, with another part of the unit 50 protruding into the large section of the gas chamber. In such an arrangement, although the unit 50 containing the acoustic damping material 53 may be at least partially located within the relatively large section 33 of the gas chamber 30, reducing space requirements, any gas that flows between the large section 33 of the gas chamber 30 and an adjoining section 32 of the gas chamber 30 flows through the acoustic damping material.

As discussed above, according to the present invention one or more sections of acoustic damping material may be provided at specific locations within a gas chamber of a support device. The respective locations that may be selected in order to damp the response of the support device at one or more resonant frequencies. It should be appreciated that the amount of acoustic damping material required at each location in order to provide the desired damping of the resonant frequency will depend upon the configuration of the gas chamber 30, which may significantly affect the resonant response, and the nature of the acoustic damping material to be used. Accordingly, in order to determine the optimum amount of acoustic damping material to use at each location, some experimentation may be required. However, in general, it should be appreciated that there is expected to be a range of amounts of acoustic damping material that are satisfactory to use. If insufficient acoustic damping material is provided at a particular location, insufficient damping of the resonant response may be provided. However, if too much acoustic damping material is provided within the gas chamber 30, the stiffness of the support device 2 may increase.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools.

Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. A support device configured to support a first part relative to a second part, minimising the transfer of vibration between the two parts, comprising:
    a supporting system configured to use gas under pressure to provide a support force between the first and second parts;
    a gas chamber connected to the supporting system and configured to contain said gas under pressure and provide said gas under pressure to the supporting system; and
    a section of acoustic damping material, arranged at a location within said gas chamber so as to separate a first gas containing region and a second gas containing region within the gas chamber, wherein the section of acoustic damping material has a first side and a second side, wherein the first gas containing region is on the first side and the second gas containing region is on the second side,
    wherein a volume of the first gas containing region is substantially the same as a volume of the second gas containing region.

2. A support device as claimed in claim 1, wherein at said location in said gas chamber, the section of acoustic damping material fills the gas chamber such that, for any gas to flow between the first and second gas containing regions, the gas must pass through the acoustic damping material.

3. A support device as claimed in claim 1, wherein the acoustic damping material is formed from at least one of wool, natural fiber, artificial fiber, metal foam, and melamine foam.

4. A support device as claimed in claim 1, wherein the section of acoustic damping material is formed from a plurality of layers of acoustic damping material, secured between end plates that are configured such that at least one of the end plates may be fixed within the gas chamber.

5. A lithographic apparatus comprising at least one support device as claimed in claim 1.

6. A lithographic apparatus as claimed in claim 5, wherein the at least one support device is arranged to support a reference frame to which is mounted at least one of a projection system configured to project a patterned beam of radiation onto a substrate and a position sensor.

7. A device manufacturing method comprising:
    projecting a patterned beam of radiation onto a substrate using a projection system; and
    supporting at least one of a position sensor and the projection system using at least one support device as claimed in claim 1.

8. The device manufacturing method as claimed in claim 7, wherein at said location in said gas chamber, the section of acoustic damping material fills the gas chamber such that, for any gas to flow between the first and second gas containing regions, the gas must pass through the acoustic damping material.

9. A support device configured to support a first part relative to a second part, minimising the transfer of vibration between the two parts, comprising:
    a supporting system configured to use gas under pressure to provide a support force between the first and second parts;
    a gas chamber connected to the supporting system and configured to contain said gas under pressure and provide said gas under pressure to the supporting system; and
    a section of acoustic damping material, arranged at a location within said gas chamber so as to separate a first gas containing region and a second gas containing region within the gas chamber, wherein the section of acoustic damping material has a first side and a second side, wherein the first gas containing region is on the first side and the second gas containing region is on the second side,
    wherein the gas chamber extends from a first end to a second end; the gas chamber is connected at the first end to the supporting system; and said location of the acoustic damping material is substantially halfway between the first and second ends.

10. A support device configured to support a first part relative to a second part, minimising the transfer of vibration between the two parts, comprising:
    a supporting system configured to use gas under pressure to provide a support force between the first and second parts;
    a gas chamber connected to the supporting system and configured to contain said gas under pressure and provide said gas under pressure to the supporting system; and
    a section of acoustic damping material, arranged at a location within said gas chamber so as to separate a first gas containing region and a second gas containing region within the gas chamber, wherein the section of acoustic damping material has a first side and a second side, wherein the first gas containing region is on the first side and the second gas containing region is on the second side,
    wherein said section of acoustic damping material is associated with a resonant frequency of the support device and said location of the section of acoustic damping material is arranged to be at a point in said gas chamber at which, in the absence of the acoustic damping material, at least one of an acoustic pressure is a minimum and a particle velocity is a maximum when the support device is excited at the resonant frequency.

11. A support device as claimed in claim 10, further comprising at least one further section of acoustic damping material, each associated with a respective resonant frequency of the support device and each provided at a respective location within said gas chamber, arranged to be a point at which, in the absence of the acoustic damping material, at least one of the acoustic pressure is a minimum and the particle velocity is a maximum when the support is excited at the respective resonant frequency.

12. A support device as claimed in claim 10, further comprising at least one additional section of acoustic damping material, configured such that there are a plurality of sections of acoustic damping material associated with the same resonant frequency of the support device, each of the plurality of sections of acoustic damping material is provided at a different location within the gas chamber at which, in the absence of the acoustic damping material, at least one of the acoustic pressure is a local minimum and the particle velocity is a local maximum when the support device is excited at the resonant frequency.

13. A support device as claimed in claim 12, wherein the gas chamber is formed from a plurality of sub-chambers that are connected together; and a respective section of acoustic damping material associated with the same resonant frequency of the support device is provided in each of the sub-chambers.

14. A support device configured to support a first part relative to a second part, minimising the transfer of vibration between the two parts, comprising:
   a supporting system configured to use gas under pressure to provide a support force between the first and second parts;
   a gas chamber connected to the supporting system and configured to contain said gas under pressure and provide said gas under pressure to the supporting system; and
   a section of acoustic damping material, arranged at a location within said gas chamber so as to separate a first gas containing region and a second gas containing region within the gas chamber, wherein the section of acoustic damping material has a first side and a second side, wherein the first gas containing region is on the first side and the second gas containing region is on the second side,
   wherein the gas chamber comprises at least a first section and a second section joined together; the cross section of the first section is at least twice the cross section of the second section; and a section of acoustic damping material is provided at the join between the first section and the second section.

15. A support device configured to support a first part relative to a second part, minimising the transfer of vibration between the two parts, comprising:
   a supporting system configured to use gas under pressure to provide a support force between the first and second parts;
   a gas chamber connected to the supporting system and configured to contain said gas under pressure and provide said gas under pressure to the supporting system;
   a section of acoustic damping material, arranged at a location within said gas chamber so as to separate a first gas containing region and a second gas containing region within the gas chamber, wherein the section of acoustic damping material has a first side and a second side, wherein the first gas containing region is on the first side and the second gas containing region is on the second side, and
   a filter provided within the gas chamber between the section of acoustic damping material and the supporting section, configured to prevent contamination from the acoustic damping material from being transferred from the acoustic damping material to the supporting section.

* * * * *